(12) United States Patent
Vitello et al.

(10) Patent No.: US 9,922,947 B2
(45) Date of Patent: Mar. 20, 2018

(54) BONDING PAD STRUCTURE OVER ACTIVE CIRCUITRY

(71) Applicant: STMICROELECTRONICS S.R.L., Agrate Brianza (IT)

(72) Inventors: Dario Vitello, Calolziocorte (IT); Federico Frego, Milan (IT); Salvatore Latino, Corbetta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/141,621

(22) Filed: Apr. 28, 2016

(65) Prior Publication Data

US 2017/0317039 A1  Nov. 2, 2017

(51) Int. Cl.
| | |
|---|---|
| H01L 23/48 | (2006.01) |
| H01L 23/52 | (2006.01) |
| H01L 29/40 | (2006.01) |
| H01L 23/00 | (2006.01) |

(52) U.S. Cl.
CPC .... H01L 24/05 (2013.01); *H01L 2224/04042* (2013.01); *H01L 2224/05011* (2013.01); *H01L 2224/05082* (2013.01); *H01L 2224/05573* (2013.01); *H01L 2924/3512* (2013.01)

(58) Field of Classification Search
CPC . H01L 2224/48227; H01L 2224/04042; H01L 2224/05093
USPC ................................................ 257/784, 786
See application file for complete search history.

(56) References Cited

U.S. PATENT DOCUMENTS

| | | | | |
|---|---|---|---|---|
| 5,700,735 | A | * | 12/1997 | Shiue ...................... H01L 24/03 257/E23.02 |
| 6,037,668 | A | * | 3/2000 | Cave ................... H01L 23/5329 257/750 |
| 6,043,144 | A | * | 3/2000 | Kuo ........................ H01L 24/03 257/E23.02 |
| 6,717,270 | B1 | * | 4/2004 | Downey ................. H01L 23/50 257/758 |
| 6,798,035 | B1 | * | 9/2004 | Low ........................ H01L 24/05 257/459 |
| 6,822,329 | B2 | * | 11/2004 | Varrot ..................... H01L 24/03 257/508 |
| 7,211,902 | B2 | * | 5/2007 | Yamaha .................. H01L 24/03 257/780 |
| 8,183,698 | B2 | * | 5/2012 | Antol ..................... H01L 23/528 257/750 |
| 2003/0218259 | A1 | * | 11/2003 | Chesire ................... H01L 24/05 257/786 |
| 2013/0127024 | A1 | * | 5/2013 | Lin ................... H01L 21/76816 257/659 |

(Continued)

*Primary Examiner* — S. V. Clark
(74) *Attorney, Agent, or Firm* — Seed IP Law Group LLP

(57) ABSTRACT

Various embodiments provide a bonding pad structure that is capable of handling increased bonding loads. In one embodiment, the bonding pad structure includes a continuous metal layer, a first discontinuous metal layer, a second discontinuous metal layer, and dielectric material. The first discontinuous metal layer and the second discontinuous metal layer each include a plurality of holes that are arranged in a pattern. The plurality of holes of the first discontinuous metal layer overlaps at least two of the plurality of holes of the second discontinuous metal layer. The dielectric material is formed between the metal layers and fills the plurality of holes of the first and second discontinuous metal layers.

22 Claims, 6 Drawing Sheets

(56) References Cited

U.S. PATENT DOCUMENTS

2013/0277860 A1\* 10/2013 Weng ................ H01L 21/76838
257/774

\* cited by examiner

BONDING PAD STRUCTURE OVER ACTIVE CIRCUITRY

BACKGROUND

Technical Field

The present disclosure is directed to bonding pad structures for integrated circuits.

Description of the Related Art

Wire bonding is a commonly used method to provide an electrical connection between one or more integrated circuits of a semiconductor chip and an external structure, such as a lead frame or substrate. Wire bonding typically includes welding a first end of a wire to a bonding pad structure connected to the integrated circuit and welding a second end of the wire to the external structure. The welding of the first end of the wire to the bonding pad structure typically includes forming a free air ball from the wire using an electrical flame-off process, and welding the free air ball to the bonding pad using pressure and ultrasonic energy.

In some cases, bonding pad structures may be unable to withstand the bonding load caused by the pressure and ultrasonic energy applied during welding. Particularly, the welding of the wire may result in metal squeezing and oxide bending, or even cracks, within the bonding pad structure. Further, it is desirable to position bonding pad structures over integrated circuits to minimize chip size and reduce costs. Consequently, any cracks that may occur within the bonding pad structure may propagate to underlying circuitry, thereby affecting the reliability of the semiconductor chip.

Moreover, it is desirable to use copper wires instead of gold wires due to copper's electrical properties, and to use wires with large diameters for high current capability. The use of copper wires, which is a harder material than gold, and wires with large diameters further increases the bonding load and may cause even greater damage to a bonding pad structure.

BRIEF SUMMARY

The present disclosure is directed to a bonding pad structure that includes a plurality of metal layers.

According to one embodiment, the bonding pad structure includes a continuous metal layer, a first discontinuous metal layer, a second discontinuous metal layer, and dielectric material.

The continuous metal layer is a top metal layer that receives a bonding ball of a wire. The first discontinuous metal layer underlies the continuous metal layer. The first discontinuous metal layer includes a first plurality of holes that are arranged in a first pattern. The second discontinuous metal layer underlies the continuous metal layer and the first discontinuous metal layer. Similar to the first discontinuous metal layer, the second discontinuous metal layer includes a second plurality of holes that are arranged in a second pattern. In one embodiment, at least two of the first plurality of holes of the first discontinuous metal layer overlap a respective hole of the second plurality of holes of the second discontinuous metal layer. Dielectric material is formed between the top metal layer and the first discontinuous metal layer, and between the first discontinuous metal layer and the second discontinuous metal layer. In addition, dielectric material fills each of the first plurality of holes of the first discontinuous metal layer and each of the second plurality of holes of the second discontinuous metal layer. The dielectric material filling the first plurality of holes and the second plurality of holes results in a first plurality of dielectric pillars in the first discontinuous metal layer and a second plurality of dielectric pillars in the second discontinuous metal layer, respectively.

According to another embodiment, portions of the first discontinuous metal layer or the second discontinuous metal layer are removed to create a plurality of metal tracks. Each of the plurality of tracks may be configured to route a respective electrical signal.

The bonding pad structure disclosed herein results in a bonding pad structure that is capable of handling large bonding loads. In one or more embodiments, the increased strength of the bonding pad structure minimizes or even eliminates micro cracks in the bonding pad structure and any underlying structures that may be caused by a wire bonding process.

DETAILED DESCRIPTION

Figure 1A:
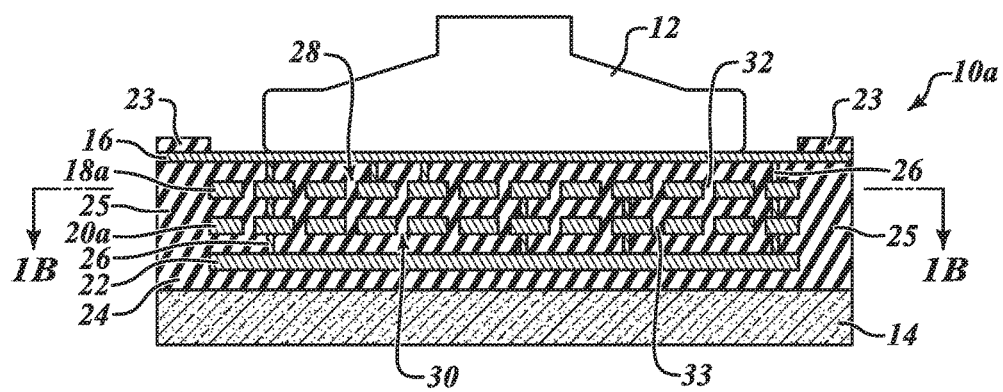
FIG. 1A is a cross-sectional view of a bonding pad structure according to one embodiment disclosed herein.

In the following description, certain specific details are set forth in order to provide a thorough understanding of various embodiments of the disclosure. However, one skilled in the art will understand that the disclosure may be practiced without these specific details. In some instances, well-known details associated with semiconductors and integrated circuits have not been described to avoid obscuring the descriptions of the embodiments of the present disclosure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

FIG. 1A is a cross-sectional view of a bonding pad structure 10a according to one embodiment. The bonding pad structure 10a is on a semiconductor substrate 14. The semiconductor substrate 14 includes one or more electrical components, such as integrated circuits. The integrated circuits may be analog or digital circuits implemented as active devices, passive devices, conductive layers, and dielectric layers formed within the substrate 14 and electrically interconnected according to a particular electrical design and function as is well known in the art.

The bonding pad structure 10a includes a continuous metal layer 16, a first discontinuous metal layer 18a, a second discontinuous metal layer 20a, a metal layer 22, dielectric material 24, and conductive vias 26. An end of a wire 12 is coupled to the continuous metal layer 16.

The continuous metal layer 16 is a top metal layer that provides a bonding pad for the wire 12. The continuous metal layer 16 does not include any holes to ensure a proper connection between the wire 12 and the bonding pad structure 10a. The continuous metal layer 16 may be any conductive material that ensures a coupling with the end of the wire 12.

Figure 1B:
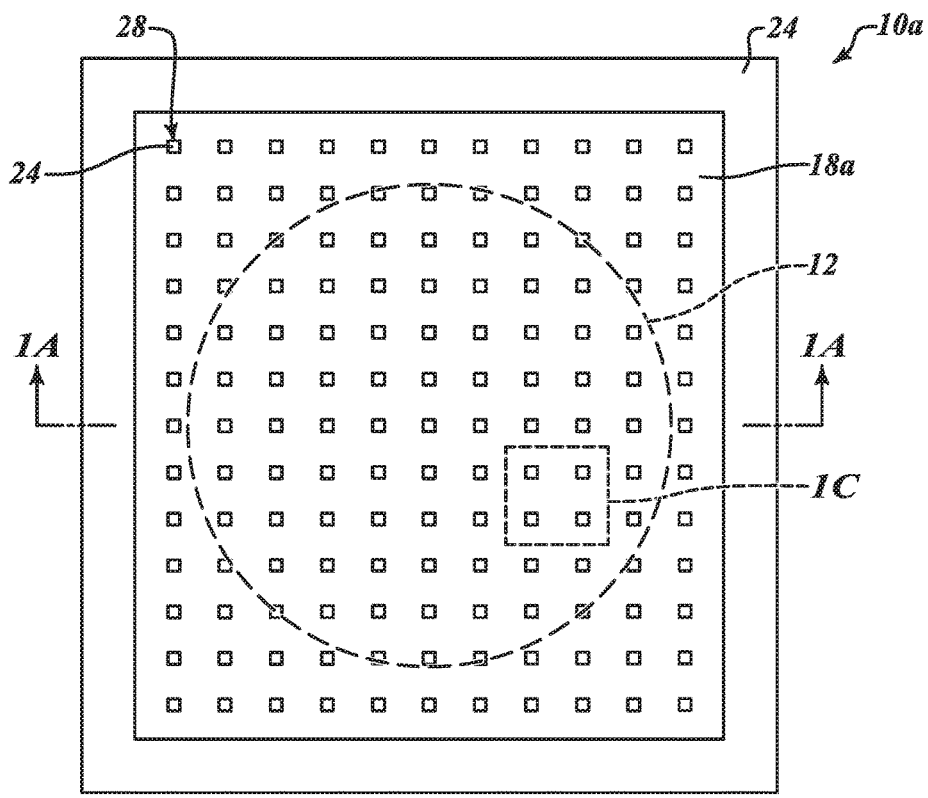
FIG. 1B is a plan view of the bonding pad structure of FIG. 1A with a continuous metal layer and dielectric material removed.

FIG. 1B is a plan view of the bonding pad structure 10a with the continuous metal layer 16 and portions of the dielectric material 24 removed to expose the first discontinuous metal layer 18a.

The first discontinuous metal layer 18a underlies the continuous metal layer 16. In one embodiment, the first discontinuous metal layer 18a underlies the continuous metal layer 16 where the wire 12 is received. An outline of the position of the wire 12 is shown in FIG. 1B.

The first discontinuous metal layer 18a includes a plurality of holes 28 that are arranged in a first pattern. The holes 28 may be arranged in any type of pattern. For example, the holes 28 may be arranged in a checkerboard pattern or in a plurality of diagonal rows. In one embodiment, as shown in FIG. 1B, the holes 28 are arranged in an array that includes a plurality of rows and a plurality of columns. As will be discussed in further detail below, the holes 28 in the first discontinuous metal layer 18a are filled by the dielectric material 24 to create a plurality of dielectric pillars.

The second discontinuous metal layer 20a underlies the continuous metal layer 16 and the first discontinuous metal layer 18a. The second discontinuous metal layer 20a, similar to the first discontinuous metal layer 18a, underlies the continuous metal layer 16 where the wire 12 is received. Also similar to the first discontinuous metal layer 18a, the second discontinuous metal layer 20a includes a plurality of holes 30. The holes 30 may be arranged in any type of pattern. In one embodiment, at least two of the plurality of holes 28 overlaps with a respective hole of the plurality of holes 30. In another embodiment, as shown in FIG. 1A, the holes 30 are arranged in the same pattern as the holes 28. Namely, each of the plurality of holes 28 overlaps a respective hole of the plurality of holes 30. In this embodiment, a plan view of the second discontinuous metal layer 20a is nearly identical to the plan view of the first discontinuous metal layer 18a shown in FIG. 1B. In some embodiments, however, the holes of each layer may overlap but offset from each other. As will be discussed in further detail below, the holes 30 in the second discontinuous metal layer 20a are filled by the dielectric material 24 to create a plurality of dielectric pillars.

The number of holes 28 of the first discontinuous metal layer 18a and the number of holes 30 of the second discontinuous metal layer 20a are shown for illustrative purposes. The first discontinuous metal layer 18a and the second discontinuous metal layer 20a may each include any number of holes. In a preferred embodiment, the first discontinuous metal layer 18a and the second discontinuous metal layer 20a each include at least two holes.

The shape of each of the holes 28 and 30 are shown for illustrative purposes. Each of the holes 28 and 30 may have any shape, including circular, oval, square, etc. For example, in one embodiment, each of the holes 28 and 30 is circle shaped and create a plurality of dielectric cylinders when filled with the dielectric material 24. The holes 28 and 30 may also have a tapered slope through the thicknesses of the first and second discontinuous metal layers 18a and 20a.

The alignment and dimensions of the holes 28 and 30 will be discussed in further detail with respect to FIGS. 1C and 1D.

In one embodiment, the first discontinuous metal layer 18a and the second discontinuous metal layer 20a have substantially the same dimensions. Namely, the width and length of the first discontinuous metal layer 18a is substantially equal to the width and length, respectively, of the second discontinuous metal layer 20a. Accordingly, the same pattern may be used to fabricate the first discontinuous metal layer 18a and the second discontinuous metal layer 20a during manufacturing.

The bonding pad structure 10a may include any number of metal layers in addition to the continuous metal layer 16, the first discontinuous metal layer 18a, and the second discontinuous metal layer 20a. In one embodiment, as shown in FIG. 1A, the bonding pad further includes the metal layer 22, which underlies the continuous metal layer 16, the first discontinuous metal layer 18a, and the second discontinuous metal layer 20a. In another embodiment, the bonding pad structure 10a does not include the metal layer 22. In a further embodiment, the bonding pad structure 10a includes a plurality of metal layers that underlie the continuous metal layer 16, the first discontinuous metal layer 18a, and the second discontinuous metal layer 20a.

Metal layers, such as metal layer 22, that are in addition to the continuous metal layer 16, the first discontinuous metal layer 18a, and the second discontinuous metal layer 20a do not have any constraints on their shape or dimensions. For example, in one embodiment, the metal layer 22 is continuous, similar to the continuous metal layer 16. In another embodiment, the metal layer 22 is discontinuous, similar to the first and second discontinuous metal layers 18a and 20a.

The continuous metal layer 16, the first discontinuous metal layer 18a, the second discontinuous metal layer 20a, and the metal layer 22 may be made of any type of metal, such as aluminum and copper. In another embodiment, the continuous metal layer 16, the first discontinuous metal layer 18a, the second discontinuous metal layer 20a, and the metal layer 22 are any conductive material, including non-metal materials.

Layers of the dielectric material 24 are formed between the substrate 14 and the metal layer 22, between the metal layer 22 and the second discontinuous metal layer 20a, between the second discontinuous metal layer 20a and the first discontinuous metal layer 18a, and between the first discontinuous metal layer 18a and the continuous metal layer 16. The layers of dielectric material electrically insulate the continuous metal layer 16, the first discontinuous metal layer 18a, the second discontinuous metal layer 20a, the metal layer 22, and any other additional metal layers from each other. The dielectric material 24 may be any insulating material, such as silicon dioxide.

The dielectric material 24 also fills each of the holes 28 and 30. The dielectric material 24 in the holes 28 and 30 provides a plurality of dielectric pillars 32 in the first discontinuous metal layer 18a and a plurality of dielectric pillars 33 in the second discontinuous metal layer 20a. As a result, when each of the holes 30 overlaps with a respective hole of the plurality of holes 28, each of the plurality of dielectric pillars 32 overlaps with a respective dielectric pillar of the plurality of dielectric pillars 33.

In one or more embodiments, the dielectric pillars 32 and 33 improve the strength of the bonding pad structure 10a. Dielectrics, being hard and rigid unlike most commonly used metals, are able to withstand greater vertical loads without significant deformation. Accordingly, the dielectric pillars 32 and 33 in the bonding pad structure 10a allow the bonding pad structure 10a to handle larger bonding loads.

In one embodiment, a layer of dielectric material 24 is also formed along a periphery of the continuous metal layer 16 to create a wall 23 of dielectric material along the edges of the continuous metal layer 16. The wall 23 of the dielectric material 24 is configured to confine the wire 12 and prevent the wire 12 from spilling over an edge of the continuous metal layer 16 and along the sides of the bonding pad structure 10a during a wire bonding process. In another embodiment, the bonding pad structure 10a does not include the wall 23 of dielectric material.

As shown in FIG. 1A, sidewalls 25 do not directly underlie the end of the wire 12. Accordingly, the sidewalls 25 do not need to withstand large bonding loads and may include any type of material, such as metal or dielectric. In one embodiment, as shown in FIG. 1A, the sidewalls 25 include the dielectric material 24. In another embodiment, the sidewalls 25 include metal layers. For example, the sidewalls 25 may include additional metal layers, or the first discontinuous metal layer 18a, the second discontinuous metal layer 20a, or the metal layer 22 may extend in to the sidewalls 25.

Conductive vias 26 interconnect the various metal layers of the bonding pad structure 10a. As shown in FIG. 1A, the conductive vias 26 provide an electrical connection between the continuous metal layer 16, the first discontinuous metal layer 18a, the second discontinuous metal layer 20a, and the metal layer 22. Although not shown, conductive vias 26 may provide an electrical connection between the metal layer 22 to a trace or another component in the substrate, such as an integrated circuit fabricated in the substrate 14. The position and number of the conductive vias 26 is shown for illustrative purposes. The bonding pad structure 10a may include any number of conductive vias 26 with multiple different configurations.

Figure 1C:
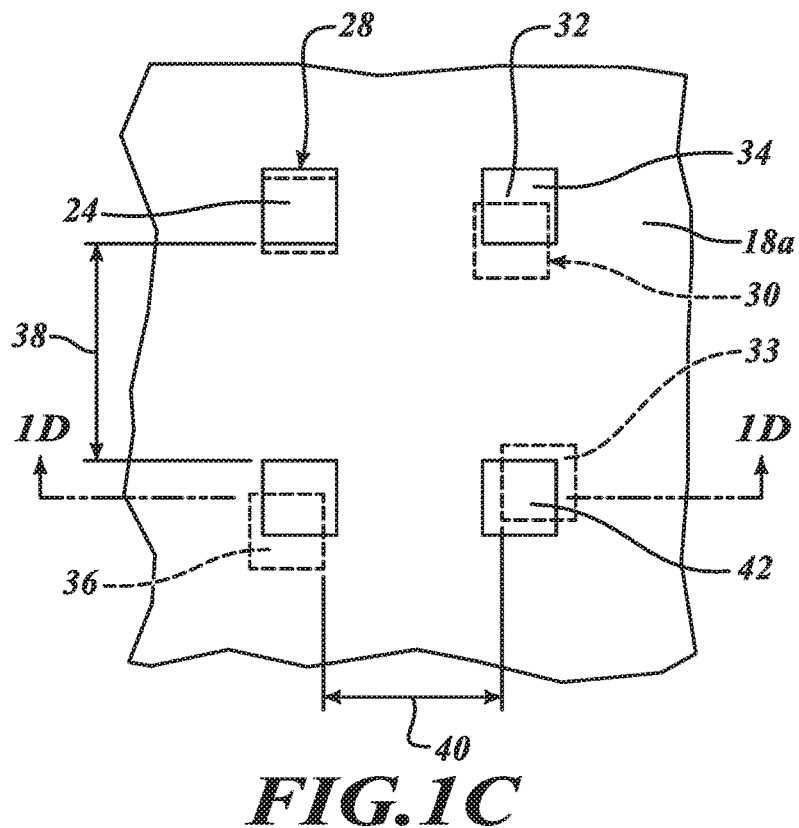
FIG. 1C is an enlarged plan view of a portion of the bonding pad structure shown in FIG. 1B.
Figure 1D:
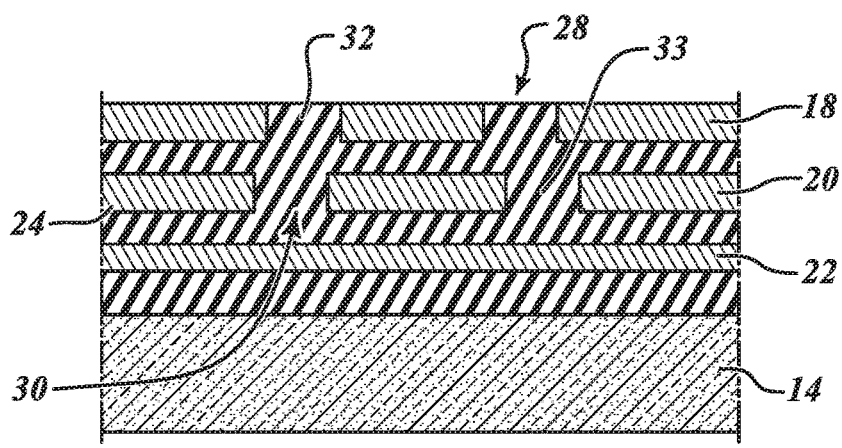
FIG. 1D is an enlarged cross-sectional view of the portion of the bonding pad structure of FIG. 1C.

FIG. 1C is an enlarged plan view of a portion of the bonding pad structure 10a shown in FIG. 1B according to principles disclosed herein. FIG. 1D is an enlarged cross-sectional view of the portion of the bonding pad structure 10a of FIG. 1C.

Each of the holes 28, or alternatively each of the dielectric pillars 32, has a cross-sectional area 34. In one embodiment, the cross-sectional area 34 is between 0.8 and 10 $\mu m^2$. The holes 28 are spaced from each other by a distance 38. In one embodiment, the distance 38 is less than 16 µm. Although distance 38 is shown vertically, it is to be appreciated that the horizontal distance between each hole 28 may also be 16 µm.

Similar to the holes 28, each of the holes 30, or alternatively each of the dielectric pillars 33, have a cross-sectional area 36. In one embodiment, the cross-sectional area 36 is between 0.8 and 10 $\mu m^2$. In another embodiment, the area 36 is substantially equal to the area 34. The holes 30 are spaced from each other by a distance 40. In one embodiment, the distance 40 is less than 16 µm. In another embodiment, the distance 40 is substantially equal to the distance 38.

As previously discussed, in one embodiment, each of the plurality of holes 28 overlap a respective hole of the plurality of holes 30. The holes 28 overlap the holes 30 by an area 42. In one embodiment, the area 42 is greater than 0.8 $\mu m^2$.

The bonding pad structure 10a has increased strength for handling larger bonding loads that may be caused by the welding of the wire 12 to the continuous metal layer 16 than previously allowed. The increased strength of the bonding pad structure 10a minimizes and may eliminate micro cracks in the bonding pad structure 10a and any underlying structures that may be fabricated in the substrate 14.

FIGS. 2A to 2I are cross-sectional views illustrating subsequent stages of manufacturing for fabricating the bonding pad structure 10a according to principles disclosed herein.

Figure 2A:
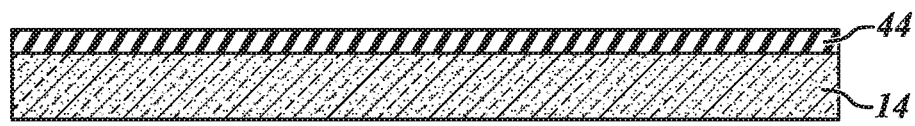
FIGS. 2A to 2I are cross-sectional views illustrating subsequent stages of manufacturing for fabricating a bonding pad structure according to one embodiment disclosed herein.

At a stage as shown in FIG. 2A, a dielectric layer 44 of the dielectric material 24 is formed over the substrate 14. The dielectric layer 44 may be formed using standard semiconductor processing techniques that are currently known or later developed. For example, the dielectric layer 44 may be deposited using sputtering or chemical vapor deposition.

Figure 2B:
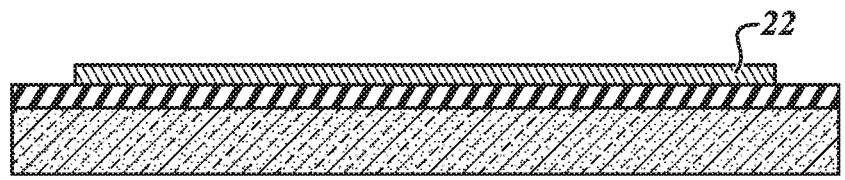

At a stage as shown in FIG. 2B, the metal layer 22 is formed over the dielectric layer 44 of FIG. 2A. The metal layer 22 is formed using standard semiconductor processing techniques known or later developed.

Figure 2C:
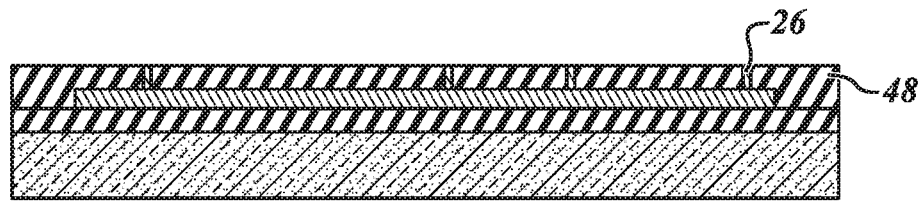

At a stage as shown in FIG. 2C, conductive vias 26 and a dielectric layer 48 of the dielectric material 24 are formed over the metal layer 22 of FIG. 2B. In one embodiment, the dielectric layer 48 is formed subsequent to the conductive vias 26 being formed. In another embodiment, the conductive vias 26 are formed subsequent to the dielectric layer 48 being formed. The conductive vias 26 and the dielectric layer 48 may be formed using standard semiconductor processing techniques known or later developed. For example, when the conductive vias 26 are formed first, the conductive vias 26 may be deposited using pattern deposition or a combination of blanket deposition and etching, followed by the dielectric layer 48 being deposited. Similarly, when the dielectric layer 48 is deposited first, the dielectric layer 48 may be deposited using pattern deposition or a combination of blanket deposition and etching, followed by the conductive vias 26 being deposited.

Figure 2D:
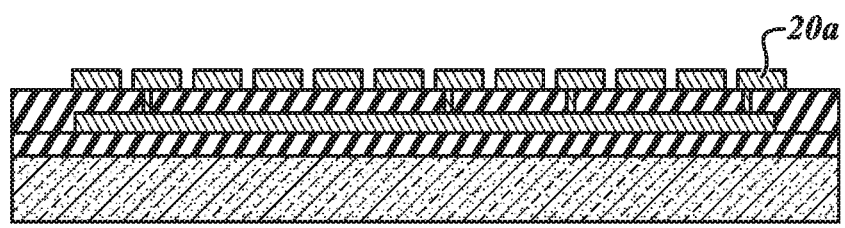

At a stage as shown in FIG. 2D, the second discontinuous metal layer 20a is formed over the conductive vias 26 and the dielectric layer 48 of FIG. 2C. The second discontinuous metal layer 20a is formed using standard semiconductor processing techniques known or later developed.

Figure 2E:
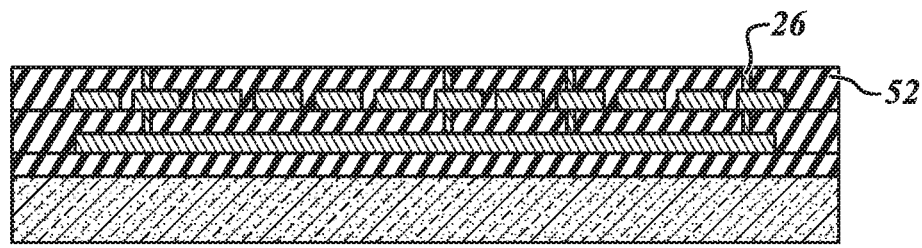

At a stage as shown in FIG. 2E, conductive vias 26 and a dielectric layer 52 of the dielectric material 24 are formed over the second discontinuous metal layer 20a of FIG. 2D. The conductive vias 26 and the dielectric layer 52 may be formed using the techniques described with respect to FIG. 2C. In one embodiment, the dielectric layer 52 is two separate dielectric layers. For example, a first dielectric layer may be formed to fill the holes of the second discontinuous metal layer 20a, and a second dielectric layer may be formed over the second discontinuous metal layer 20a and the first dielectric layer. The first and second dielectric layers of the dielectric layer 52 may be made of dielectric materials that are the same or different from each other.

Figure 2F:
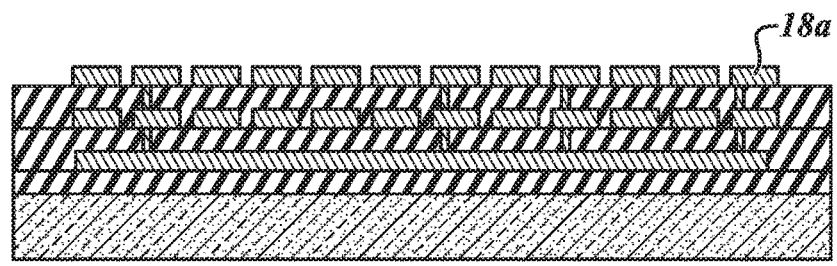

At a stage as shown in FIG. 2F, the first discontinuous metal layer 18a is formed over the conductive vias 26 and the dielectric layer 52 of FIG. 2E. The first discontinuous metal layer 18*a* is formed using the techniques described with respect to FIG. 2D.

Figure 2G:
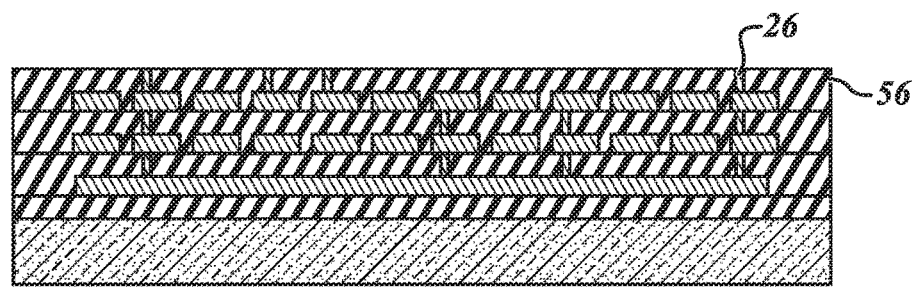

At a stage as shown in FIG. 2G, conductive vias 26 and a dielectric layer 56 of the dielectric material 24 are formed over the first discontinuous metal layer 18*a* of FIG. 2F. The conductive vias 26 and the dielectric layer 56 may be formed using the techniques described with respect to FIGS. 2C and 2E.

Figure 2H:
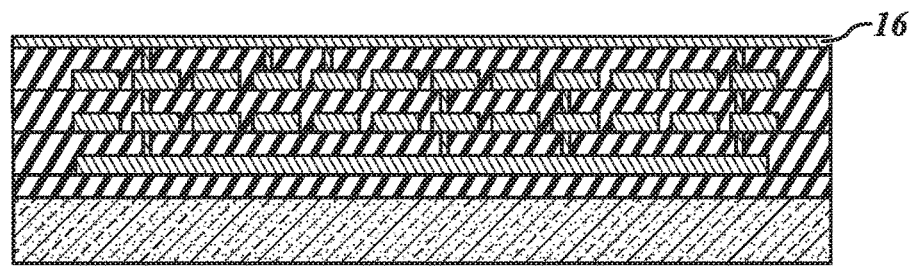

At a stage as shown in FIG. 2H, the continuous metal layer 16 is formed over the conductive vias 26 and a dielectric layer 56 of FIG. 2G. The continuous metal layer 16 may be formed using standard semiconductor processing techniques known or later developed. For example, the continuous metal layer 16 may be deposited using sputtering or chemical vapor deposition.

Figure 2I:
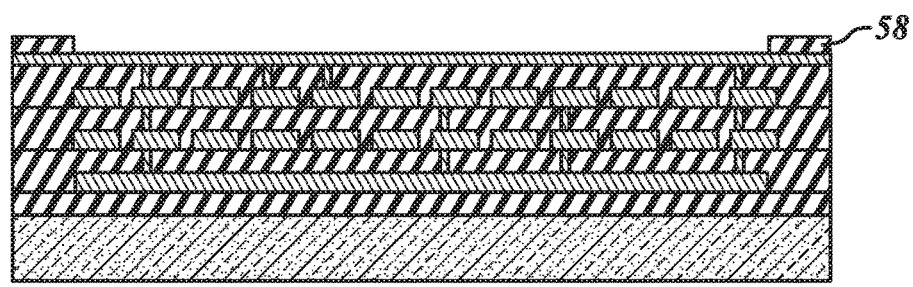

At a stage as shown in FIG. 2I, a dielectric layer 58 is formed over the continuous metal layer 16. The dielectric layer 58 may be formed using standard semiconductor processing techniques known or later developed. For example, the dielectric layer 58 may be deposited using pattern deposition or a combination of blanket deposition and etching.

In another embodiment, the first discontinuous metal layer 18*a* and the second discontinuous metal layer 20*a* are customized to route a plurality of electrical signals.

The dielectric layers 44, 48, 52, 56, 58 may be any dielectric material and may be materials that are the same or different from each other.

Figure 3A:
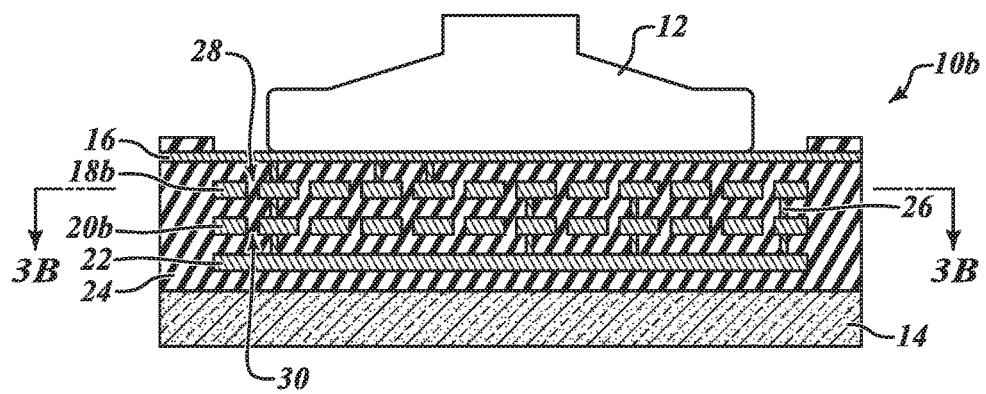
FIG. 3A is a cross-sectional view of a bonding pad structure according to another embodiment disclosed herein.
Figure 3B:
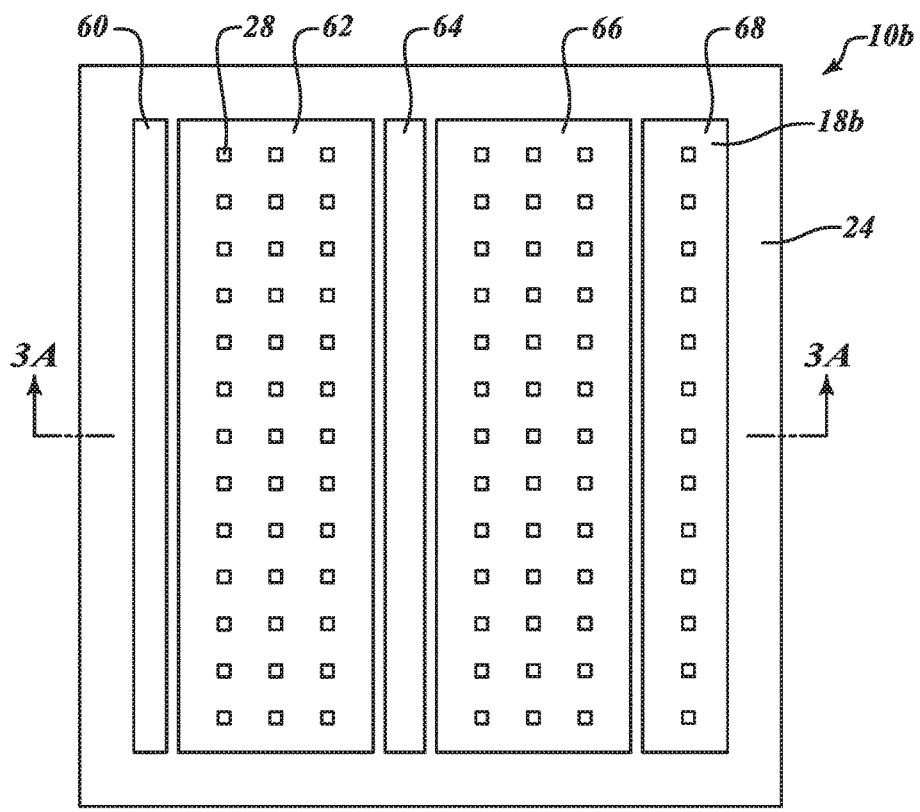
FIG. 3B is a plan view of the bonding pad of FIG. 3A with a continuous metal layer and dielectric material removed.

FIG. 3A is a cross-sectional view of a bonding pad structure 10*b* according to another embodiment. FIG. 3B is a plan view of the bonding pad structure 10*b* with the continuous metal layer 16 and portions of the dielectric material 24 removed to expose the first discontinuous metal layer 18*b*.

The bonding pad structure 10*b* of FIGS. 3A and 3B are similar in structure and function to the bonding pad structure 10*a* of FIGS. 1A-1D. The difference between bonding pad structure 10*a* of FIGS. 1A-1D and the bonding pad structure 10*b* of FIGS. 3A and 3B is that portion of a first discontinuous metal layer 18*b* may be electrically isolated from other portions of the first discontinuous metal layer 18*b*. Similarly, portions of the second discontinuous metal layer 20*b* may be electrically isolated from other portions of the second discontinuous metal layer 20*b*.

As shown in detail in FIG. 3B, portions of the first discontinuous metal layer 18*b* are removed to create a plurality of metal tracks 60, 62, 64, 66, and 68. Each of the plurality of tracks 60, 62, 64, 66, and 68 may be electrically insulated from each other by the dielectric material 24 and be configured to route a respective electrical signal. For example, as shown in FIGS. 3A and 3B, the metal track 62 may be electrically coupled to the continuous metal layer 16 through the conductive vias 26, and the metal tracks 60, 64, 66, and 68 may be electrically coupled to other respective bonding pad structures not shown in FIGS. 3A and 3B.

The second discontinuous metal layer 20*b* may also have portions removed to create a plurality of metal tracks. In one embodiment, the metal tracks of the second discontinuous metal layer 20*b* have the same shape as the metal tracks 60, 62, 64, 66, and 68. Accordingly, a plan view of the second discontinuous metal layer 20*b* may be nearly identical to the plan view of the first discontinuous metal layer 18*b* shown in FIG. 3B. In another embodiment, the metal tracks of the second discontinuous metal layer 20*b* have different shapes from the metal tracks 60, 62, 64, 66, and 68.

Although not shown, one or more of the metal tracks 60, 62, 64, 66, and 68 may be coupled to an electrical trace formed in the dielectric material 24 and coupled to another component as is well known in the art.

Figure 4A:
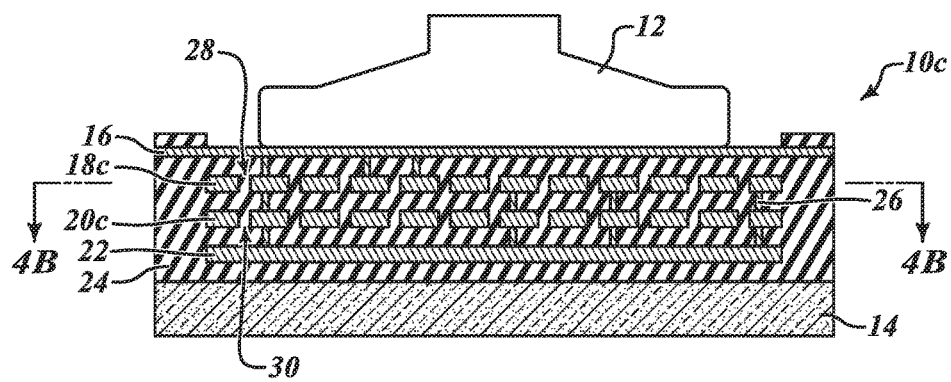
FIG. 4A is a cross-sectional view of a bonding pad structure according to another embodiment disclosed herein.
Figure 4B:
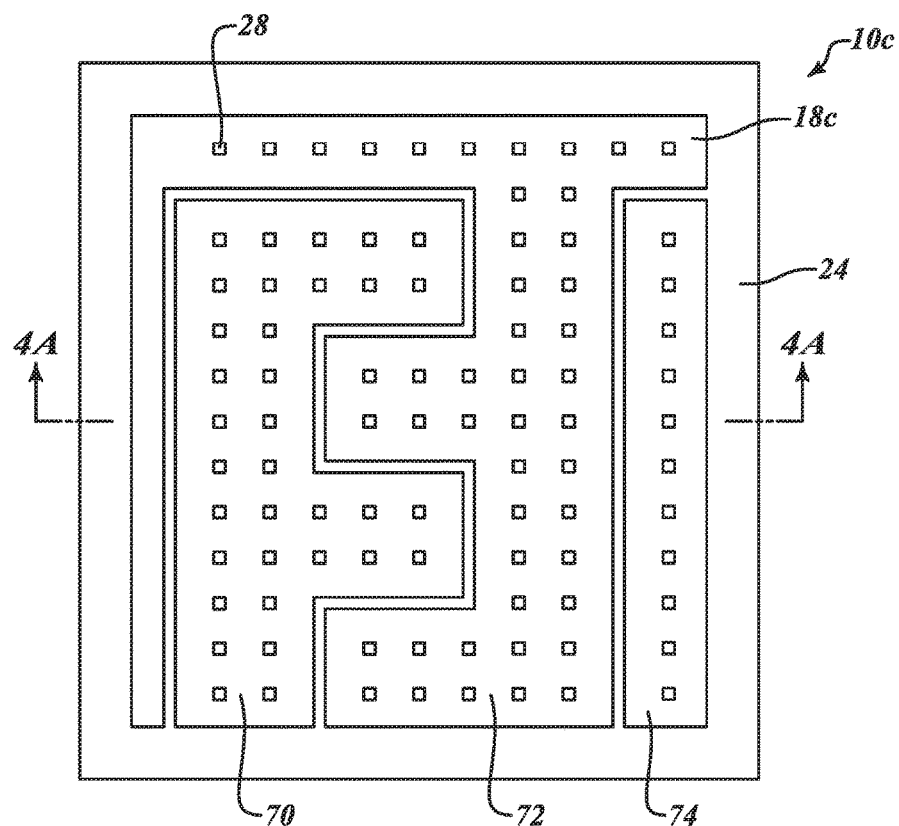
FIG. 4B is a plan view of the bonding pad structure of FIG. 4A with a continuous metal layer and dielectric material removed.

The metal tracks 60, 62, 64, 66, and 68 are shown for illustrative purposes. The first discontinuous metal layer 18*b* and the second discontinuous metal layer 20*b* each may have portions removed to form any number of metal tracks having any type of shape. For example, FIG. 4A is a cross-sectional view of a bonding pad structure 10*c* according to a further embodiment. FIG. 4B is a plan view of the bonding pad structure 10*c* of FIG. 4A with the continuous metal layer 16 and dielectric material removed to expose a first discontinuous metal layer 18*c*. As shown in FIG. 4B, portions of the first discontinuous metal layer 18*c* are removed to create a plurality of metal tracks 70, 72, and 74. Similar to the second discontinuous metal layer 20*b*, the second discontinuous metal layer 20*c* may also have portions removed to create a plurality of metal tracks.

In accordance with at least one embodiment, the bonding pad structures disclosed herein are capable of handling increased bonding loads. The increased strength of the bonding pad structure minimizes and may eliminate micro cracks in the bonding pad structure and any underlying structures that may be caused by a wire bonding process.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a semiconductor substrate having a surface; and
   a bonding pad structure formed over the surface of the semiconductor substrate, the bonding pad structure including:
   a first metal layer over the surface;
   a first plurality of holes extending through the first metal layer;
   a second metal layer over the first metal layer;
   a second plurality of holes extending through the second metal layer;
   a third metal layer over the second metal layer, the third metal layer having a continuous surface, the third metal layer remains exposed and is configured to receive an end of a bonding wire or conductive ball;
   insulating material between the substrate and the first metal layer, between the first metal layer and the second metal layer, and between the second metal layer and the third metal layer, the insulating material filling the first and second plurality of holes;
   a first conductive via electrically coupling the first metal layer and the second metal layer to each other, the first conductive via extending through the insulating material between the first metal layer and the second metal layer; and
   a second conductive via electrically coupling the second metal layer and the third metal layer to each other, the second conductive via extending through the insulating material between the second metal layer and the third metal layer.

2. The device of claim 1, wherein each of the first plurality of holes overlap a respective hole of the second plurality of holes.

3. The device of claim 1, wherein the first plurality of holes are arranged in an array having a plurality of rows and a plurality of columns.

4. The device of claim 1, wherein the first metal layer includes a first portion and a second portion that is electrically insulated from the first portion.

5. The device of claim 1, wherein a hole of the first plurality of holes has a cross-sectional area between 0.8 and 10 µm².

6. The device of claim 1, wherein a first hole of the first plurality of holes is spaced from a second hole of the first plurality of holes by a distance that is smaller than 16 µm.

7. The device of claim 1, wherein a first hole of the first plurality of holes and a second hole of the second plurality of holes overlap by an area that is greater than 0.8 µm².

8. The device of claim 1, wherein the insulating material is a plurality of layers of insulating material, wherein a first layer of insulating material is between the substrate and the first metal layer, a second layer of insulating material is between the first metal layer and the second metal layer, and a third layer of insulating material is between the second metal layer and the third metal layer.

9. The device of claim 8, wherein the first, second, and third layers of insulating materials are the same material.

10. The device of claim 8, wherein the first, second, and third layers of insulating materials are different materials.

11. The device of claim 1, wherein the insulating material filling the first plurality of holes is a first layer of insulating material and the insulating material between the first metal layer and the second metal layer is a second layer of insulating material, the first and second layers of insulating material being different materials.

12. A device, comprising:
 a semiconductor substrate;
 a bonding pad over the semiconductor substrate;
 a first conductive layer between the semiconductor substrate and the bonding pad, the first conductive layer including a first plurality of holes;
 a second conductive layer between the first conductive layer and the semiconductor substrate, the second conductive layer including a second plurality of holes that each overlap a respective hole of the first plurality of holes, each of the first and second plurality of holes having a cross-sectional area between 0.8 and 10 µm²; and
 insulating material that fills the first and second plurality of holes.

13. The device of claim 12, wherein the first plurality of holes are arranged in an array having a plurality of rows and a plurality of columns.

14. The device of claim 12, wherein the first plurality of holes are spaced from each other by a distance that is smaller than 16 µm.

15. The device of claim 12, wherein a first hole of the first plurality of holes and a second hole of the second plurality of holes overlap by an area that is greater than 0.8 µm².

16. The device of claim 12, wherein the first conductive layer includes a first portion and a second portion that is electrically insulated from the first portion.

17. The device of claim 12, wherein the insulating material in the first plurality of holes is different from the insulating material in the second plurality of holes.

18. A device, comprising:
 a semiconductor substrate;
 a bonding pad over the semiconductor substrate;
 a first conductive layer between the semiconductor substrate and the bonding pad, the first conductive layer including a first plurality of holes;
 a second conductive layer between the first conductive layer and the semiconductor substrate, the second conductive layer including a second plurality of holes that each overlap a respective hole of the first plurality of holes, a first hole of the first plurality of holes and a second hole of the second plurality of holes overlap by an area that is greater than 0.8 µm²; and
 insulating material that fills the first and second plurality of holes.

19. The device of claim 18, wherein the first plurality of holes are arranged in an array having a plurality of rows and a plurality of columns.

20. The device of claim 18, wherein each of the first and second plurality of holes has a cross-sectional area between 0.8 and 10 µm².

21. The device of claim 18, wherein the first plurality of holes are spaced from each other by a distance that is smaller than 16 µm.

22. The device of claim 18, wherein the first conductive layer includes a first portion and a second portion that is electrically insulated from the first portion.

* * * * *